United States Patent
Takeuchi et al.

[11] Patent Number: 6,045,642
[45] Date of Patent: Apr. 4, 2000

[54] METHOD FOR PRODUCING CERAMIC DIAPHRAGM STRUCTURE

[75] Inventors: Yukihisa Takeuchi, Nishikamo-gun; Tsutomu Nanataki, Toyoake; Katsuyuki Takeuchi, Nagoya, all of Japan

[73] Assignee: NGK Insulators, Ltd., Japan

[21] Appl. No.: 09/287,191

[22] Filed: Apr. 6, 1999

Related U.S. Application Data

[63] Continuation of application No. 08/871,605, Jun. 9, 1997, abandoned.

[30] Foreign Application Priority Data

Jun. 14, 1996 [JP] Japan .................................. 8-154338

[51] Int. Cl.[7] ................................................. B32B 31/26
[52] U.S. Cl. .................................. 156/89.11; 156/89.12; 310/324
[58] Field of Search ........................... 156/89.11, 89.12; 310/324

[56] References Cited

U.S. PATENT DOCUMENTS

| | | |
|---|---|---|
| 5,545,461 | 8/1996 | Takeuchi et al. ..................... 428/138 |
| 5,600,197 | 2/1997 | Takeuchi et al. ..................... 310/328 |
| 5,634,999 | 6/1997 | Takeuchi et al. . |
| 5,681,410 | 10/1997 | Takeuchi et al. . |
| 5,733,670 | 3/1998 | Takeuchi et al. . |
| 5,798,168 | 8/1998 | Takeuchi et al. ..................... 428/174 |

FOREIGN PATENT DOCUMENTS

| | | |
|---|---|---|
| 0 671 772 A1 | 8/1995 | European Pat. Off. . |
| 0 713 255 A1 | 5/1996 | European Pat. Off. . |
| 0 713 255 A1 | 6/1996 | European Pat. Off. . |

*Primary Examiner*—Curtis Mayes
*Attorney, Agent, or Firm*—Parkhurst & Wendell, L.L.P.

[57] ABSTRACT

A method for producing a ceramic diaphragm structure includes preparing a ceramic green substrate having at least one window and a plurality of layers, and a thin ceramic green sheet. The ceramic green sheet is superposed on the ceramic green substrate to cover the window and thereby provide a unitary laminate. The laminate is then fired so that the ceramic green sheet provides a diaphragm portion which protrudes in a direction away from the window. The average sintering temperature difference or the average shrinkage-rate difference, of the layers of the ceramic green substrate, is larger than zero.

6 Claims, 4 Drawing Sheets

METHOD FOR PRODUCING CERAMIC DIAPHRAGM STRUCTURE

This is a Continuation of application Ser. No. 08/871,605 filed Jun. 9, 1997 now abandoned.

BACKGROUND OF THE INVENTION AND RELATED ART STATEMENT

The present invention relates to a method for producing a ceramic diaphragm structure which is used as a constitutional member in various kinds of sensors, piezoelectric/electrostrictive actuators, or the like.

A ceramic diaphragm structure has a structure in which a thin and flexible diaphragm plate is superposed on a substrate having at least one window portion so as to cover the window portion and to work as a diaphragm. Such a ceramic diaphragm structure is used for various kinds of sensors by constituting so that a diaphragm portion detects a bending displacement originated from a subject to be measured by an adequate means, or used as a constituting member of a piezoelectric/electrostrictive actuator by giving a pressure to the pressure room formed inside the actuator by deformation of the diaphragm portion.

A ceramic diaphragm structure is produced by unitarily superposing a thin ceramic green sheet (hereinafter referred to as a green sheet) on a ceramic green substrate (hereinafter referred to as a green substrate) to obtain a laminate, and subsequently firing the laminate. After firing, the green substrate becomes a substrate, and the green sheet becomes a diaphragm plate. In recent years, there has been used a ceramic diaphragm structure 3 which has a diaphragm portion 1 having a protrudent shape toward the side opposite to a window portion 8 of a substrate 2 as shown in FIG. 1, so as to prevent a crack or a depression in a firing step. Such a diaphragm portion 1 having a protrudent shape as described above can have a higher inherent resonance frequency in comparison to a diaphragm portion having a flat shape. Further, it is recognized that a diaphragm portion having a protrudent shape is excellent in mechanical strength, and mechanical strength is not hindered upon sintering a film formed on the surface of the diaphragm portion 1.

When a ceramic diaphragm structure having a protrudent shape is produced, there are used materials for a green substrate and a green sheet, i.e., materials within a range shown by a slanting line in FIG. 2, which satisfies the following formulae 1), 2), and 3).

$$S(\text{substrate}) - S(\text{sheet}) \geq -0.08\{T_{70}(\text{substrate}) - T_{70}(\text{sheet})\} - 1 \quad \text{1)}$$

$$0 \leq T_{70}(\text{substrate}) - T_{70}(\text{sheet}) \leq 300 \quad \text{2)}$$

$$S(\text{substrate}) - S(\text{sheet}) \leq 20 \quad \text{3)}$$

S(substrate) and S(sheet) denote shrinkage rates (%) of the green substrate and the green sheet, respectively. $T_{70}$(substrate) and $T_{70}$(sheet) denote mid-sintering temperatures of the green substrate and the green sheet.)

Japanese Patent Laid-Open 8-51238 discloses that by using such a material, a protrusion can be made in a green sheet toward the side opposite to a window portion in a substrate during firing without any crack or the like. That is, a thin ceramic portion can be formed by setting differences in shrinkage rate and mid-sintering temperature between a green substrate and a green sheet.

Incidentally, a shrinkage rate (%) means a shrinkage rate (%) of a green substrate and a green sheet independently fired at the same temperature as firing a laminate in a direction of a surface, and the shrinkage rate (%) is shown by {(length before firing−length after firing)/length before firing}×100(%). A direction of a surface is not the direction of thickness, and it means a predetermined direction on the surface where a green substrate or a green sheet is molded. A mid-sintering temperature means a firing temperature at which a shrinkage reaches 70% of the aforementioned shrinkage rate, S(substrate) and S(sheet) in a firing step, and a mid-sintering temperature is a barometer showing a sintering speed.

However, the method disclosed in Japanese Patent Laid-Open 8-51238 is on the supposition that a shrinkage rate and a mid-sintering temperature of a green substrate are even from a portion near a green sheet to a portion apart from the green sheet. In this method, a diaphragm structure has a large waviness, and a warpage is caused wholly in a ceramic plate including diaphragm structures. As shown in FIG. 5 and FIG. 7, a ceramic diaphragm structure 3 is constituted of a substrate 2 and a diaphragm plate 12. A plurality of the ceramic diaphragm structures 3 constitutes a ceramic plate 15. It is difficult to reform the aforementioned warpage and waviness even if the ceramic plate 15 is subjected to firing again with loading. When a load on the ceramic plate 15 is too large, a diaphragm portion and/or a substrate damage(s). When a warpage or a waviness is left as it is, a dimensional preciseness of a diaphragm structure deteriorates, and therefore, a preciseness of printing of a pattern on a diaphragm plate deteriorates, and/or a variance of a thickness of a film formed on the diaphragm plate is generated. Accordingly, when such a diaphragm structure is used for a sensor, the sensor has a variance of detection preciseness; and when it is used for a piezoelectric/electrostrictive actuator, the actuator has deterioration or variance of displacement.

Accordingly, the present invention aims to provide a method for producing a ceramic diaphragm structure, which can form a diaphragm portion having a protrusion toward the side opposite to a window portion of a substrate and which can advantageously minimize a waviness of a diaphragm structure and/or a warpage of a ceramic plate including diaphragm structures.

SUMMARY OF THE INVENTION

According to the present invention, there is provided a method for producing a ceramic diaphragm structure, comprising:

superposing a thin ceramic green sheet having at least one layer on a ceramic green substrate having at least one window portion and a plurality of layers so as to cover the window portion to obtain a unitary laminate; and firing the unitary laminate so that a diaphragm portion has a protrusion toward a side opposite to the window portion;

wherein the ceramic green substrate and the ceramic green sheet satisfy the formulae:

$$S(\text{substrate}) - S(\text{sheet}) \geq -0.08\{T_{70}(\text{substrate}) - T_{70}(\text{sheet})\} - 1 \quad \text{1)}$$

$$0 \leq T_{70}(\text{substrate}) - T_{70}(\text{sheet}) \leq 300 \quad \text{2)}$$

and $$S(\text{substrate}) - S(\text{sheet}) \leq 20 \quad \text{3)}$$

(S(substrate), and S(sheet) denote shrinkage rates (%) of the ceramic green substrate and the ceramic green sheet, respectively. $T_{70}$(substrate) and $T_{70}$(sheet) denote mid-sintering temperatures (° C.) of the ceramic green substrate and the ceramic green sheet, respectively.)

and an average sintering temperature difference, shown by the formula $$\sum_{n=1}^{N} T_{70}(\text{substrate})_n \int_{t_n}^{t_{n+1}} \times dx \qquad 4)$$

(N denotes the number of layers constituting the ceramic green substrate. $T_{70}$(substrate)$_n$ denotes a mid-sintering temperature (° C.) of a layer positioned in number n place from the bottom of the laminate in the ceramic green substrate having the ceramic green sheet thereon. $t_n$ and $t_{n+1}$ denote distances from a lower and an upper surfaces, respectively, of the layer positioned in numbers n place to a neutral line of the substrate after firing the unitary laminate, with putting − for a surface under the neutral line and + for a surface over the neutral line.)

of the layers of the ceramic green substrate is larger than 0.

According to the present invention, there is also provided a method for producing a ceramic diaphragm structure, comprising:

superposing a thin ceramic green sheet having at least one layer on a ceramic green substrate having at least one window portion and plurality of layers so as to cover the window portion to obtain a unitary laminate; and firing the unitary laminate so that a diaphragm portion has a protrusion toward a side opposite to the window portion;

wherein the ceramic green substrate and the ceramic green sheet satisfy the formulae:

$$S(\text{substrate}) - S(\text{sheet}) \geq -0.08\{T_{70}(\text{substrate}) - T_{70}(\text{sheet})\} - 1 \qquad 1)$$

$$0 \leq T_{70}(\text{substrate}) - T_{70}(\text{sheet}) \leq 300 \qquad 2)$$

and $$S(\text{substrate}) - S(\text{sheet}) \leq 20 \qquad 3)$$

S(substrate), and S(sheet) denote shrinkage rates (%) of the ceramic green substrate and the ceramic green sheet, respectively. $T_{70}$(substrate) and $T_{70}$(sheet) denote mid-sintering temperatures (° C.) of the ceramic green substrate and the ceramic green sheet, respectively.)

and an average shrinkage-rate difference, shown by the formula 5)

$$\sum_{n=1}^{N} S(\text{substrate})_n \int_{t_n}^{t_{n+1}} \times dx \qquad 5)$$

(N denotes the number of layers constituting the ceramic green substrate. S(substrate)$_n$ denotes a shrinkage rate (%) of a layer positioned in number n place from the bottom of the laminate in the ceramic green substrate having the ceramic green sheet thereon. $t_n$ and $t_{n+1}$ denote distances from a lower and an upper surfaces, respectively, of the layer positioned in numbers n place to a neutral line of the substrate after firing the unitary laminate, with putting − for a surface under the neutral line and + for a surface over the neutral line.)

of the layers of the ceramic green substrate is larger than 0.

Preferably, a mid-sintering temperature (° C.) obtained by formula 6)

$$\sum_{n=1}^{M} [A_n \times T_{70}(\text{substrate})_n] / A \qquad 6)$$

(M denotes the number of layers positioned under the neutral line among the layers constituting a substrate after firing the unitary laminate. $A_n$ denotes a thickness of a layer positioned in number n place from the bottom of the ceramic substrate after firing the unitary laminate. However, concerning the layer positioned in number M, $A_n$ denotes a distance from the lower surface of the layer to the neutral line. $T_{70}$(Substrate)n denotes a mid-sintering temperature (° C.) of a layer positioned in number n place from the bottom of the laminate in the ceramic green substrate having the ceramic green sheet thereon. A denotes a distance from the lower surface of the lowest layer to the neutral line of the substrate after firing the unitary laminate.)

is larger than a mid-sintering temperature (° C.) of the ceramic green sheet, the mid-sintering temperature (° C.) being obtained by the formula 7)

$$\sum_{n=1}^{L} [B_n \times T_{70}(\text{sheet})_n] / B \qquad 7)$$

(L denotes the number of layers constituting the ceramic green sheet. $T_7 1$(sheet)$_n$ denotes a mid-sintering temperature (° C.) of a layer positioned in number n place from the bottom of the laminate constituting the ceramic green sheet when the ceramic green sheet is positioned in the upside of the ceramic green substrate. $B_n$ denotes a thickness of a layer positioned in number n place from the bottom of the layers constituting a diaphragm plate after firing the unitary laminate. B denotes a thickness of the diaphragm plate.)

The ceramic green sheet is preferably made of a partially stabilized zirconia, completely stabilized zirconia, alumina or a mixture thereof, or a raw material which become one of the aforementioned materials after being fired, any of them having an average particle diameter of 0.05–1.0 μm.

DETAILED DESCRIPTION OF THE PREFERRED EMBODIMENTS

Figure 1:
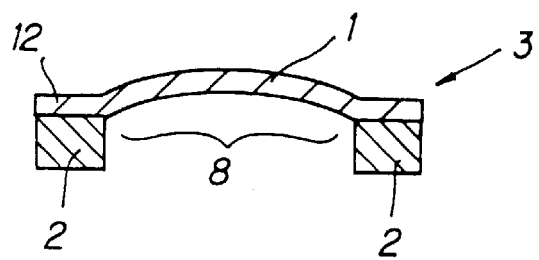
FIG. 1 is a cross sectional view showing an embodiment of a ceramic diaphragm structure having a diaphragm portion having a protrudent shape.
Figure 2:
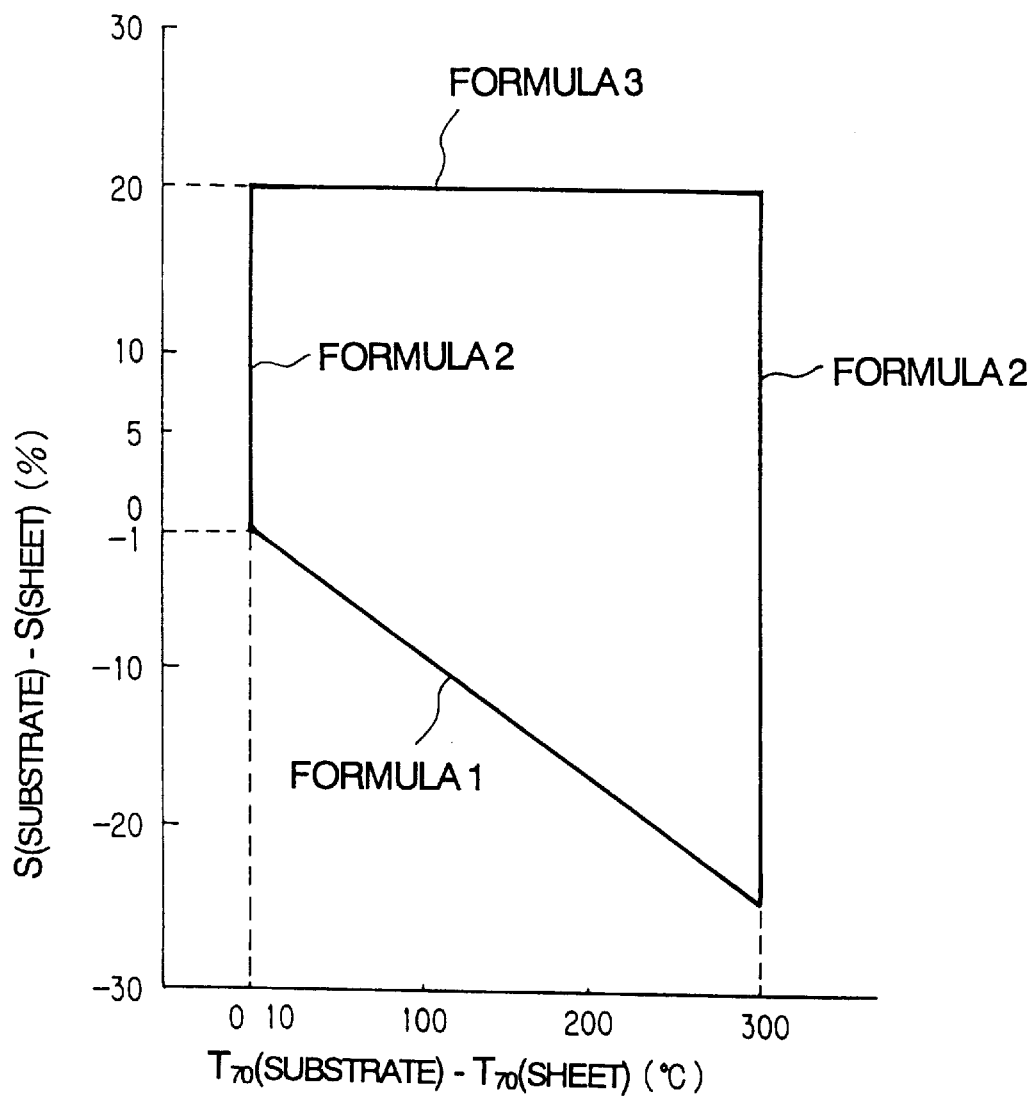
FIG. 2 is a graph showing a range of values of shrinkage rates and mid-sintering temperatures of a green substrate and a green sheet, so as to give a diaphragm portion a protrudent shape.

In the present invention, a ceramic diaphragm structure is produced by using a green substrate and a green sheet, both having shrinkage rates and mid-sintering temperatures satisfying the following formulae 1), 2), and 3):

$$S(\text{substrate}) - S(\text{sheet}) \geq -0.08\{T_{70}(\text{substrate}) - T_{70}(\text{sheet})\} - 1 \quad 1)$$

$$0 \leq T_{70}(\text{substrate}) - T_{70}(\text{sheet}) \leq 300 \quad 2)$$

$$S(\text{substrate}) - S(\text{sheet}) \leq 20 \quad 3)$$

(Symbols in the formulae mean as described above.) Further, in the substrate a difference in average sintering temperature shown by the formula 4) should be larger than 0, or a difference in average shrinkage rate shown by the formula 5) should be larger than 0.

$$\sum_{n=1}^{N} T_{70}(\text{substrate})_n \int_{t_n}^{t_{n+1}} \times dx \quad 4)$$

$$\sum_{n=1}^{N} S(\text{substrate})_n \int_{t_n}^{t_{n+1}} \times dx \quad 5)$$

Figure 3:
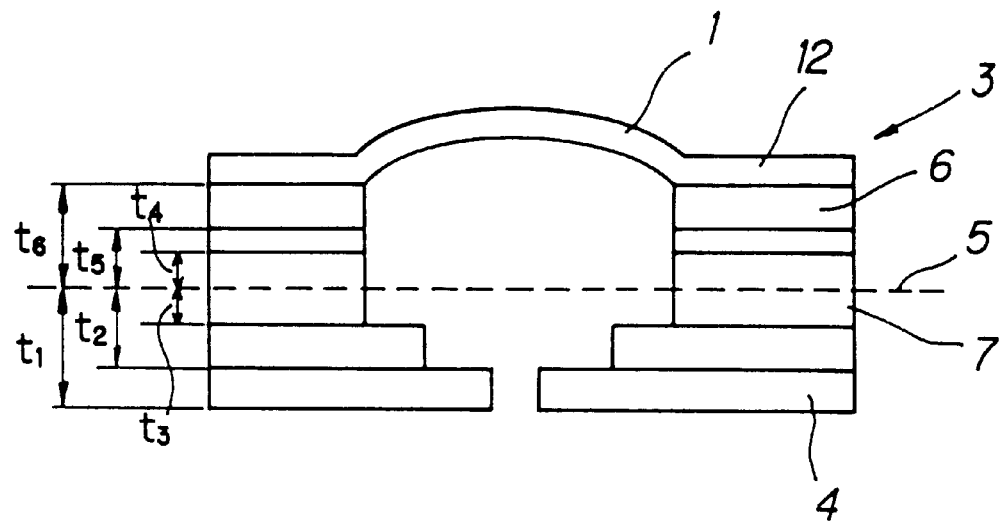
FIG. 3 is a cross sectional view showing another example of a ceramic diaphragm structure having a diaphragm portion having a protrudent shape.

In the formula 4), N denotes a number of layers constituting a green substrate. $T_{70}(\text{substrate})_n$ denotes mid-sintering temperature (° C.) of a layer positioned in number n place from the bottom of the laminate in the ceramic green substrate having the ceramic green sheet thereon as shown in FIG. 3. $t_n$ and $t_{n+1}$ denote distances from a lower and an upper surfaces, respectively, of the layer positioned in numbers n place to a neutral line 5 of the substrate, with putting − for a surface under the neutral line and + for a surface over the neutral line. The neutral line 5 is a line formed by connecting middle points to one another between the lower surface of the lowest layer 4 and the upper surface of the layer 6 positioned in number N place after firing the unitary laminate. In the formula 5), $S(\text{substrate})_n$ denote a shrinkage rate (%) of a layer positioned in number n place from the lowest layer of the substrate having a green sheet thereon.

Incidentally, S(substrate) in the formula 1) can be calculated by the following formula 8):

$$S(\text{substrate}) = \sum_{n=1}^{N} C'_n S(\text{substrate})_n / C \quad 8)$$

(N and S(substrate), mean as described above. $C_n$ denotes a thickness of the layer positioned in number n from the bottom of the unitary laminate after firing the unitary laminate. C denotes a thickness of a substrate after firing the unitary laminate.) $T_{70}(\text{substrate})$ can be calculated by the following formula 9):

$$T_{70}(\text{substrate}) = \sum_{n=1}^{N} C'_n T_{70}(\text{substrate})_n / C \quad 9)$$

(N, $T_{70}(\text{substrate})_n$, $C_n$, and C mean as described above.) When a green sheet is constituted of a plurality of layers, S(sheet) and $T_{70}(\text{sheet})$ can be calculated in the same manner.

Therefore, according to the method of the present invention, influence of a mid-sintering temperature and a shrinkage rate of a green substrate to a green sheet with a change by a distance from the green sheet is adjusted. That is, a green substrate is constituted of a plurality of layers each having an independent mid-sintering temperature and an independent shrinkage rate, and the values are adjusted. Accordingly, a diaphragm portion can have a protrudent shape toward the side opposite to the window portion formed in a substrate, and a waviness of a diaphragm structure and/or a warpage of a ceramic plate including diaphragm structures can be advantageously minimized.

Figure 4:
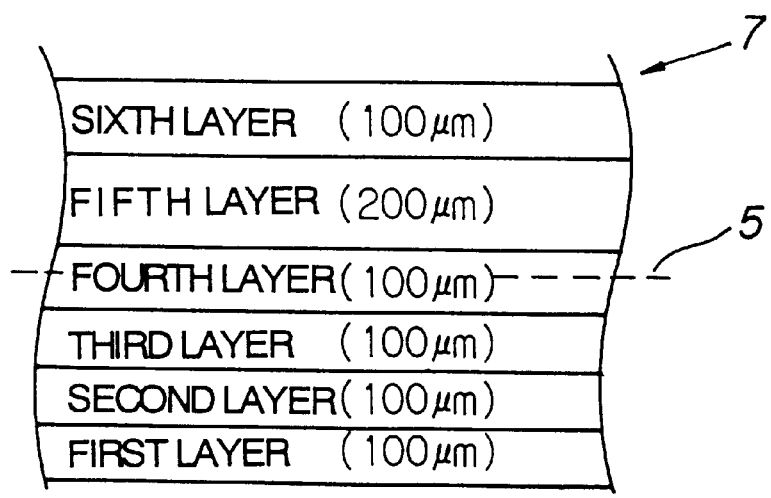
FIG. 4 is a partial, cross sectional view showing an embodiment of a ceramic substrate after firing the unitary laminate having a plurality of layers.

Specifically, in a substrate 7 after firing the unitary laminate shown in FIG. 4, differences in average sintering temperature and in average shrinkage rate are calculated by formulae 4) and 5) as follows:

Difference in average sintering temperature =

$$T_1 \times [(1/2)X^2]_{-350}^{-250} + T_2 \times [(1/2)X^2]_{-250}^{-150} + T_3 \times [(1/2)X^2]_{-150}^{-50} +$$
$$T_4 \times [(1/2)X^2]_{-50}^{50} + T_5 \times [(1/2)X^2]_{50}^{250} + T_6 \times [(1/2X^2]_{250}^{350}$$
$$= (-60000T_1 - 40000T_2 - 20000T_3 + 0T_4 + 60000T_5 + 60000T_6)/2$$

Difference in average shrinkage rate =

$$S_1 \times [(1/2)X^2]_{-350}^{-250} + S_2 \times [(1/2)X^2]_{-250}^{-150} + S_3 \times [(1/2)X^2]_{-150}^{-50} +$$
$$S_4 \times [(1/2)X^2]_{-50}^{50} + S_5 \times [(1/2)X^2]_{50}^{250} + S_6 \times [(1/2X^2]_{250}^{350}$$
$$= (-60000S_1 - 40000S_2 - 20000S_3 + 0S_4 + 60000S_5 + 60000S_6)/2$$

Incidentally, $T_1$–$T_6$ and $S_1$–$S_6$ denote a mid-sintering temperature and a shrinkage rate, respectively, of the layer positioned in number n place. The fifth layer has a thickness of 200 μm after firing. The other layer has a thickness of 100 μm after firing.

When layers constituting a green substrate are connected to one another, a connecting layer is formed in each of the gaps between the layers. In such a case, the connecting layer is treated as a substrate in the aforementioned calculation.

In the present invention, a mid-sintering temperature (° C.) of a green substrate in a portion below a neutral line of the substrate after firing the unitary laminate is preferably higher than that of a green sheet in view of enhancing a forming stability of a protrudent shape.

The mid-sintering temperature (° C.) of a green substrate below the neutral line after firing is expressed by the following formula 6):

$$\sum_{n=1}^{M} [A_n \times T_{70}(\text{substrate})_n]/A \quad 6)$$

(M denotes the number of layers positioned below a neutral line among the layers constituting a substrate after firing a unitary laminate. $A_n$ denotes a thickness of the layer positioned in number n place from the lowest layer among the layers constituting a substrate after firing the unitary laminate. However, regarding the layer positioned in number M from the lowest layer, $A_n$ denotes a thickness from the lower surface of the layer to the neutral line. $T_{70}(\text{substrate})_n$ means as described above. A denotes a distance from the lower surface of the lowest layer of a substrate to the neutral line after firing the unitary laminate.) A mid-sintering temperature (° C.) of a green sheet is expressed by the following formula 7):

$$\sum_{n=1}^{L} [B_n \times T_{70}(\text{sheet})_n]/B \quad 7)$$

(L denotes the number of layers constituting a green sheet. $T_{70}(\text{sheet})_n$ denotes a mid-sintering temperature (° C.) of a layer positioned in number n place from the lowest layer among the layers constituting a green sheet when the unitary laminate is positioned so that the green sheet is disposed upside of the substrate. $B_n$ denote a thickness of the layer positioned in number n place from the lowest layer among the layers constituting a diaphragm plate. B denote a thickness of a diaphragm plate.

In the present invention, a ceramic diaphragm structure is produced by using a green substrate and a green sheet satisfying the above condition. Specifically, it is produced as follows:

In the beginning, a green substrate and a green sheet are molded. As a material of a green substrate and a green sheet, there may be used mullite, beryllia, spinel, titania, aluminum nitride, silicon nitride, stabilized zirconia, a partially stabilized zirconia, alumina, or a mixture thereof. Alternatively, there may be used a raw material which becomes one of the aforementioned material after firing.

Particularly, a material for a green sheet is preferably a partially stabilized zirconia, stabilized zirconia, alumina, a mixture thereof, or a raw material which becomes one of these materials after firing. More preferably, as the present inventor disclosed in Japanese Patent Laid Open 5-270912, there is used a material having as a main component a partially stabilized zirconia consisting mainly of tetragonal crystals or a mixed crystals consisting of at least two kinds selected from tetragonal crystals, cubic crystals, monoclinic crystals.

A material for the green substrate is preferably the same as that of the green sheet in view of ensuring reliability and unitary forming of the green substrate and the green sheet. Alternatively, there may be used a ceramic material such as a glass-ceramic or cordierite.

Incidentally, the green sheet is desirably formed with using a partially stabilized zirconia, stabilized zirconia, alumina, a material containing a mixture thereof as a main component, or a raw material which becomes one of these materials after firing, the material having a form of powder having an average particle diameter of 0.05–1.0 µm in view of mechanical strength of a diaphragm portion.

A diaphragm plate of a ceramic diaphragm structure is preferably 30 µm or less, more preferably 3–20 µm. The diaphragm plate has a relative density (bulk density/ theoretical density) of preferably 90% or more, more preferably 95% or more, furthermore preferably 98% or more in view of strength, Young's modulus, or the like.

A thickness of a substrate is not particularly limited, and it is suitably determined depending on its use of a diaphragm structure. However, a total thickness of a substrate is preferably 50 µm or more in order to increase an effect of the present invention.

A green substrate and a green sheet can be obtained by preparing a slurry or a paste obtained by adding a binder, a plasticizer, a dispersant, a sintering aid, an organic solvent, etc., to the aforementioned material; molding constituent members by a conventionally known method such as a doctor blading, a calendering method, a printing method, and a reverse roll coater method; subjecting the constituent members to cutting, trimming, punching, or the like as necessary; and piling up the constituent members so as to give a predetermined shape and a predetermined thickness.

Then, a green sheet is superposed on a green substrate so as to prepare a unitary laminate. The green sheet is superposed on the green substrate so as to cover a window portion formed in the green sheet. The unitary laminate can be obtained by heat-pressing or the like.

Finally, the unitary laminate is subjected to firing so as to obtain a ceramic diaphragm structure which diaphragm portion has a protrudent shape toward the side opposite to the window portion formed in a substrate. Incidentally, a firing temperature is preferably 1200–1700° C., more preferably 1300–1600° C.

EXAMPLE

The present invention is described in more detail on the basis of Examples. However, the present invention is by no means limited to the Examples.

Example 1

By a method of the present invention, there is produced a ceramic diaphragm structure having a substrate having two layers so as to satisfy the aforementioned formulae 1), 2), 3), and 4).

To 100 parts by weight of a partially stabilized zirconia powder (containing 0.1–0.5% of alumina) having an average particle diameter of 0.4–1.0 µm were added 7.6 parts by weight of poly(vinyl butyral) as a binder, 3.8 parts by weight of dioctyl phthalate as a plasticizer, 80 parts by weight of mixture of toluene and 2-propanol in the ratio of 1:1 (by volume) as a solvent, and 0–2.0 parts by weight of sorbitan fatty acid ester as a dispersant as necessary. They were mixed together by a ball mill for 5–50 hours so as to obtain a slurry. The slurry was deaired and a viscosity was adjusted so that the slurry for the green sheet has a viscosity of 2000 cps and that the slurry for the green substrate has a viscosity of 20000 cps.

The aforementioned slurry was molded so as to have a predetermined shape by a doctor blading to obtain each layer constituting a green substrate and by a reverse roll coater method to obtain a green sheet.

Incidentally, a shrinkage rate becomes smaller when a time for mixing a material by a ball mill is longer, or when an amount of a dispersant is larger. A mid-sintering temperature becomes lower when a time for mixing in a ball mill is longer or when an amount of alumina is larger. By controlling these factors, a shrinkage rate of a green substrate is adjusted to be 20.76%, and a shrinkage rate of a green sheet is adjusted to be 21.50%.

A mid-sintering temperature of the first layer (when a ceramic diaphragm structure is disposed so that a diaphragm plate is placed in the upper side, a layer positioned in number n from the bottom is referred to as nth layer. Hereinbelow, the same manner.) of a green substrate was adjusted to be 1310° C., a mid-sintering temperature of the second layer was adjusted to be 1330° C., and a mid-sintering temperature of a green sheet was adjusted to be 1272° C.

Figure 5:
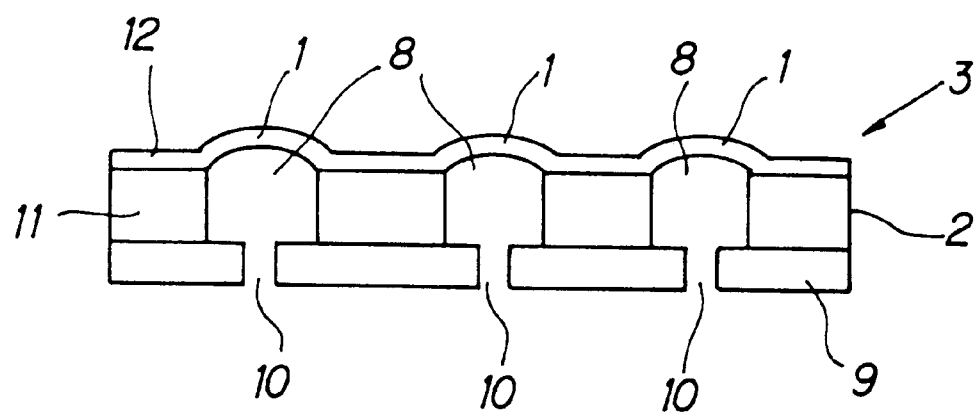
FIG. 5 is a cross sectional view showing still another example of a ceramic diaphragm structure having a diaphragm portion having a protrudent shape.

By laminating the aforementioned layers, a green substrate consisting of two layers was produced. Further, a green sheet is superposed on the green substrate, and they are heated and pressed at 100° C. with a pressure of 200 Kg/cm$^2$ so as to obtain a unitary laminate. The unitary laminate is fired at 1500° C. for 3 hours so as to produce a ceramic plate including four diaphragm structures 3 each having three window portions 8 shown in FIG. 5. A window portion, i.e., a diaphragm portion 1 had a rectangular shape having dimensions of 0.5×0.7 mm after firing. A distance between two adjacent windows along the side having 0.5 mm was 0.3 mm. Additionally, the first layer 9 of the substrate 2 was provided with a throughhole 10 having a diameter of 0.2 mm after firing and connecting with a window portion 8. In the substrate 2, the first layer 9 and the second layer 11 each had a thickness of 100 µm after firing. A diaphragm plate 12 had a thickness of 10 µm after firing.

The aforementioned diaphragm structures were measured for a presence of protrudent shape in a diaphragm. Each of the diaphragm structures were measured for amount of a waviness, and a ceramic plate including the diaphragm structures were measured for amounts of a warpage. The results are shown in Table 1. Additionally, Table 1 expresses differences in average sintering temperatures and in average shrinkage rate of a green substrate, and a mid sintering temperature ($T_7$(substrate)), a shrinkage rate (S(substrate)) of a whole green substrate, and a mid-sintering temperature in the portion of a green substrate under the neutral line which were calculated on the basis of formulae 4), 5), 8), 9) and 6). Incidentally, when these are calculated, samples of 10×10 mm taken from a sheet constituting these layers were measured for a mid-sintering temperature ($T_{70}$(Substrate)n) and a shrinkage rate (S(substrate)n) of each layer of the green substrate. The results are also shown in Table 1.

Examples 2–8

In each of Examples 2–8, a ceramic plate having four ceramic diaphragm structures which satisfies the aforementioned formulae 1), 2), 3), and at least one of the formulae 4) and 5) and which consists of two layers was produced in the same manner as in Example 1 except that a mid-sintering temperature and a shrinkage rate of each of the layers constituting a green substrate were changed. In each of Examples 4 and 8, a mid-sintering temperature and a shrinkage rate of a green sheet were 1262° C. and 21.38%, respectively.

The aforementioned diaphragm structures were measured for a protrudent shape of a diaphragm portion, a waviness of the diaphragm structures and/or a warpage of a ceramic plate including the diaphragm structures. The results are shown in Table 1. In Table 1 are also shown values such as a difference in average sintering temperature of a green substrate, the values being calculated on the basis of a mid-sintering temperature and a shrinkage rate of each of layers constituting the green substrate and the aforementioned formulae.

Comparative Examples 1–6

A ceramic plate having diaphragm structures which satisfies the aforementioned formulae 1), 2), and 3) or the formulae 2) and 3) and which satisfies none of the formulae 4) and 5) or the formulae 1), 4) and 5) was produced in the same manner as in Example 1 except that a mid-sintering temperature and a shrinkage rate of each of the layers constituting a green substrate are different from those of Example 1. Incidentally, a mid-sintering temperature and a shrinkage rate of a green sheet are 1272° C. and 21.50%, respectively, which are the same as those of Example 1.

The aforementioned diaphragm structures were measured for a protrudent shape of a diaphragm portion, a waviness of the diaphragm structures and/or a warpage of a ceramic plate including the diaphragm structures. The results are shown in Table 2. In Table 2 are also shown values such as a difference in average sintering temperature of a green substrate, the values being calculated on the basis of a mid-sintering temperature and a shrinkage rate of each of layers constituting the green substrate and the aforementioned formulae.

TABLE 1

| Example | n layer | Thickness (μm) | $T_{70}$(Substrate)$_n$ (° C.) | $T_{70}$(Substrate) (° C.) | S(Substrate)$_n$ (%) | S(Substrate) (%) | Difference in average sintering temperature | Difference in average shrinkage rate | Mid-sintering temperature below neutral line (° C.) | Warpage and/or waviness | Presence of Protrudent shape |
|---|---|---|---|---|---|---|---|---|---|---|---|
| 1 | First layer  | 100 | 1310 | 1320 | 20.76 | 20.76 | >0 | 0  | 1310 | small | present |
|   | Second layer | 100 | 1330 |      | 20.76 |       |    |    |      |       |         |
| 2 | First layer  | 100 | 1272 | 1291 | 20.00 | 20.36 | >0 | >0 | 1272 | small | present |
|   | Second layer | 100 | 1310 |      | 20.72 |       |    |    |      |       |         |
| 3 | First layer  | 100 | 1340 | 1355 | 20.47 | 20.47 | >0 | 0  | 1340 | small | present |
|   | Second layer | 100 | 1370 |      | 20.47 |       |    |    |      |       |         |
| 4 | First layer  | 100 | 1330 | 1365 | 20.45 | 20.45 | >0 | 0  | 1330 | small | present |
|   | Second layer | 100 | 1400 |      | 20.45 |       |    |    |      |       |         |
| 5 | First layer  | 100 | 1322 | 1322 | 20.70 | 20.84 | 0  | >0 | 1322 | small | present |
|   | Second layer | 100 | 1322 |      | 20.97 |       |    |    |      |       |         |
| 6 | First layer  | 100 | 1322 | 1322 | 20.00 | 20.54 | 0  | >0 | 1322 | small | present |
|   | Second layer | 100 | 1322 |      | 21.07 |       |    |    |      |       |         |
| 7 | First layer  | 100 | 1310 | 1310 | 22.48 | 22.78 | 0  | >0 | 1310 | small | present |
|   | Second layer | 100 | 1310 |      | 23.07 |       |    |    |      |       |         |
| 8 | First layer  | 100 | 1360 | 1360 | 18.00 | 20.19 | 0  | >0 | 1360 | small | present |
|   | Second layer | 100 | 1360 |      | 22.38 |       |    |    |      |       |         |

TABLE 2

| Comparative Example | n layer | Thickness (μm) | $T_{70}$ (Substrate)$_n$ (° C.) | $T_{70}$ (Substrate) (° C.) | S(Substrate)$_n$ (%) | S(Substrate) (%) | Difference in average sintering temperature | Difference in average shrinkage rate | Mid-sintering temperature below neutral line (° C.) | Warpage and/or waviness | Presence of Protrudent shape |
|---|---|---|---|---|---|---|---|---|---|---|---|
| 1 | First layer | 100 | 1272 | 1272 | 20.00 | 20.00 | 0 | 0 | 1272 | small | absent |
|   | Second layer | 100 | 1272 |   | 20.00 |   |   |   |   |   |   |
| 2 | First layer | 100 | 1310 | 1310 | 20.72 | 20.72 | 0 | 0 | 1310 | medium | present |
|   | Second layer | 100 | 1310 |   | 20.72 |   |   |   |   |   |   |
| 3 | First layer | 100 | 1330 | 1330 | 20.79 | 20.79 | 0 | 0 | t330 | large | present |
|   | Second layer | 100 | 1330 |   | 20.79 |   |   |   |   |   |   |
| 4 | First layer | 100 | 1330 | 1320 | 20.76 | 20.76 | <0 | 0 | 1330 | large | present |
|   | Second layer | 100 | 1310 |   | 20.76 |   |   |   |   |   |   |
| 5 | First layer | 100 | 1322 | 1322 | 20.97 | 20.97 | 0 | 0 | 1322 | large | present |
|   | Second layer | 100 | 1322 |   | 20.97 |   |   |   |   |   |   |
| 6 | First layer | 100 | 1322 | 1322 | 20.97 | 20.84 | 0 | <0 | 1322 | very large | present |
|   | Second layer | 100 | 1322 |   | 21.70 |   |   |   |   |   |   |

Example 9

A ceramic plate having diaphragm structures which substrate consists of five layers was produced so as to satisfy the formulae 1), 2), 3), 4), and 5).

With 100 weight parts of an alumina powder having an average diameter ranging from 0.2 to 0.8 μm were mixed 11 weight parts of poly(vinyl butyral) resin as a binder, 5.5 weight parts of dioctyl phthalate as a plasticizer, 11 weight parts of a mixture of toluene and 2-propanol in the ratio of 1:1 by volume as a solvent, and 0–3.0 weight parts of sorbitan fatty acid ester as a dispersant as necessary by a ball mill for 5–50 hours so as to prepare a slurry. The slurry was deaired, and viscosity of the slurry was adjusted to be 2000 cps for a green sheet and 20000 cps for a green substrate. Each of the layers constituting a green substrate and a green sheet was formed in the same manner as in Example 1.

By controlling the same factor as Example 1, a shrinkage rate and a mid-sintering temperature of the green sheet were adjusted to be 21.40% and 1270° C., respectively. On the other hand, shrinkage rates of the green substrate were adjusted to be 20.50%, 20.63%, 20.59%, 20.38%, and 20.79% from the first layer, and mid-sintering temperatures of the green substrate were adjusted to be 1310° C., 1340° C., 1330° C., 1360° C., and 1330 C.

Figure 6:
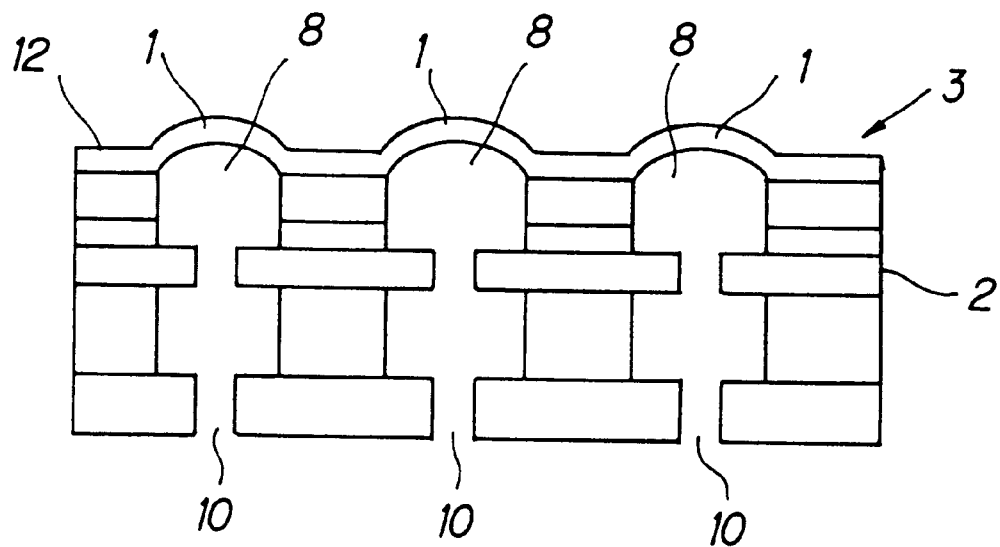
FIG. 6 is a cross sectional view showing still another example of a ceramic diaphragm portion having a protrudent shape.
Figure 7:
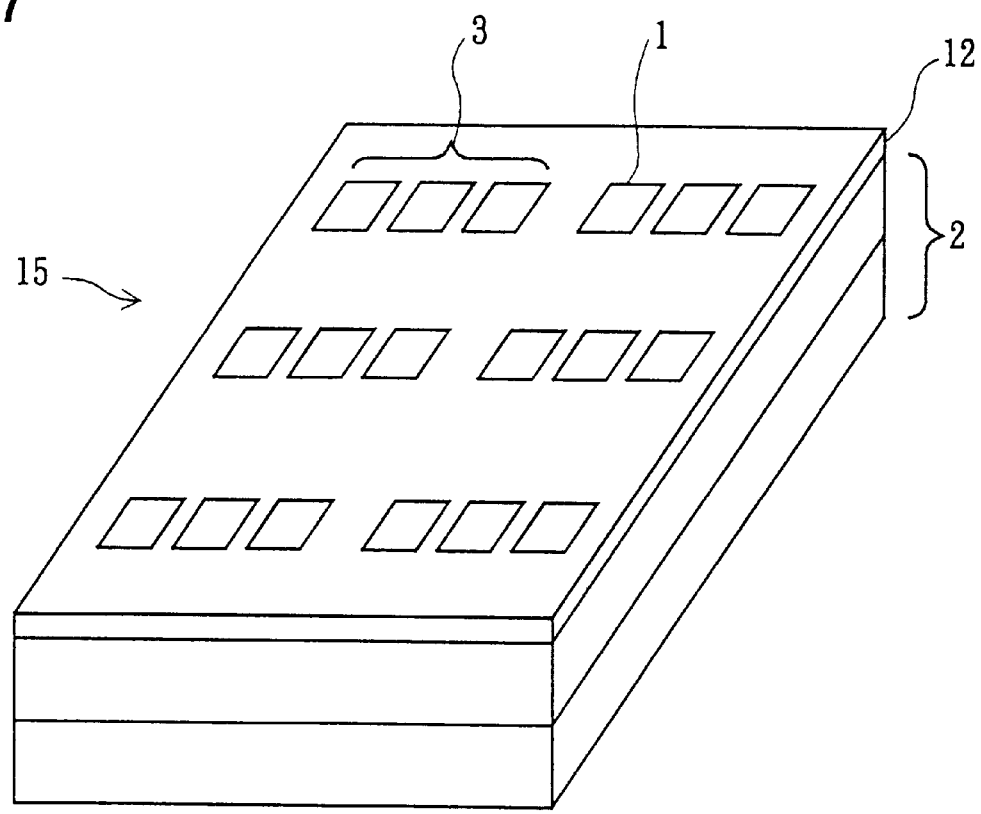
FIG. 7 is a perspective view showing a ceramic plate having a plurality of ceramic diaphragm structures.

The aforementioned layers were piled up so as to obtain the green substrate consisting of five layers. Then, the green sheet was superposed on the green substrate so as to obtain a unitary laminate, which was subjected to a heat pressing treatment at 100° C. under 200 kg/cm² for one minute. The unitary laminate was fired at 1550° C. for 3 hours so as to obtain a ceramic plate 15 having four diaphragm structures 3 having three windows 8 as shown in FIG. 6. A shape of each of the window portion 8, i.e., diaphragm portion 1 has a rectangular shape having dimensions of 0.8×1.2 mm after firing. Distance between two adjacent windows 8 was 0.5 mm along a side of 0.8 mm after firing. The fourth and the second layers of the substrate 2 had the similar shape as the fifth layer. The first and the third layers were provided with throughholes 10 each having a diameter of 0.2 mm after firing and being connected with each of the window portions 8. The first, second, third, fourth, and fifth layers of the substrate 2 had a thickness of 200 μm, 250 μm, 100 μm, 50 μm, and 100 μm, respectively. A thickness of a diaphragm plate 12 had a thickness of 20 μm.

The aforementioned diaphragm structures were measured for a protrudent shape of a diaphragm portion, a waviness of the diaphragm structures and/or a warpage of a ceramic plate including the diaphragm structures. The results are shown in Table 3. In Table 3 are also shown values such as differences in average sintering temperature and average shrinkage rate of a green substrate and a mid-sintering temperature and a shrinkage rate of the whole green substrate and a mid-sintering temperature of a portion below a neutral line of a green substrate, the values being calculated on the basis of the aforementioned formulae.

Example 10

A ceramic plate having diaphragm structures which substrate consists of five layers was produced so as to satisfy the formulae 1), 2), 3), and 4) in the same manner as in Example 9 except that each of the layers constituting a green substrate had a different mid-sintering temperature and a different shrinkage rate from those of Example 9. Incidentally, the green sheet had a mid-sintering temperature of 1260° C. and a shrinkage rate of 21.30%.

The aforementioned diaphragm structures were measured for a protrudent shape of a diaphragm portion, a waviness of the diaphragm structures and/or a warpage of a ceramic substrate including the diaphragm structures. The results are shown in Table 3. In Table 3 are also shown values such as a difference in average sintering temperature of a green substrate, the values being calculated on the basis of a mid-sintering temperature and a shrinkage rate of each of layers constituting the green substrate and the aforementioned formulae.

Comparative Example 7

A ceramic plate having diaphragm structures which satisfies the formulae 1), 2), and 3), and which does not satisfy 4) was produced in the same manner as in Example 9 except that a mid-sintering temperature and a shrinkage rate of each of layers constituting a green substrate were different from those of Example 9. Incidentally, a mid-sintering temperature and a shrinkage rate of a green sheet used for a diaphragm plate were 1270° C. and 21.40%, respectively, as in Example 9.

The aforementioned diaphragm structures were measured for a protrudent shape of a diaphragm portion, a waviness of the diaphragm structures and/or a warpage of a ceramic plate including the diaphragm structures. The results are shown in Table 3. In Table 3 are also shown values such as a difference in average sintering temperature of a green substrate, the values being calculated on the basis of a mid-sintering temperature and a shrinkage rate of each of layers constituting the green substrate and the aforementioned formulae.

TABLE 3

| n layer | Thickness (μm) | $T_{70}$ (Substrate)$_n$ (° C.) | $T_{70}$ (Substrate) (° C.) | S(Substrate)$_n$ (%) | S(Substrate) (%) | Difference in average sintering temperature | Difference in average shrinkage rate | Mid-sintering temperature below neutral line (° C.) | Warpage and/or waviness | Presence of Protrudent shape |
|---|---|---|---|---|---|---|---|---|---|---|
| Example 9 | | | | | | | | | | |
| First layer | 200 | 1310 | 1330 | 20.50 | 20.59 | >0 | >0 | 1323 | small | present |
| Second layer | 250 | 1340 | | 20.63 | | | | | | |
| Third layer | 100 | 1330 | | 20.59 | | | | | | |
| Fourth layer | 50 | 1360 | | 20.38 | | | | | | |
| Fifth layer | 100 | 1330 | | 20.79 | | | | | | |
| Example 10 | | | | | | | | | | |
| First layer | 200 | 1330 | 1336 | 20.72 | 20.78 | >0 | <0 | 1326 | small | present |
| Second layer | 250 | 1320 | | 20.91 | | | | | | |
| Third layer | 100 | 1345 | | 20.78 | | | | | | |
| Fourth layer | 50 | 1370 | | 20.38 | | | | | | |
| Fifth layer | 100 | 1360 | | 20.79 | | | | | | |
| Comparative Example 7 | | | | | | | | | | |
| First layer | 200 | 1360 | 1325 | 20.72 | 20.53 | <0 | <0 | 1339 | large | present |
| Second layer | 250 | 1310 | | 20.30 | | | | | | |
| Third layer | 100 | 1300 | | 20.53 | | | | | | |
| Fourth layer | 50 | 1315 | | 20.38 | | | | | | |
| Fifth layer | 100 | 1320 | | 20.79 | | | | | | |

In each Example, all the diaphragm portions had a protrudent shape, and there was only a small degree of waviness caused in the diaphragm structures and/or a warpage of a ceramic plate including the diaphragm structures. On the other hand, in each Comparative Example, some of the diaphragm portions did not have a protrudent shape. Concerning the diaphragm portions which had a protrudent shape in Comparative Examples, the diaphragm structures or a ceramic plate including the diaphragm structures had a large degree of warpage or waviness.

In a method of the present invention, mid-sintering temperatures and shrinkage rates of a green substrate and a green sheet are controlled so as to satisfy predetermined formulae. Accordingly, it makes possible an adjustment in consideration of a change of influence of a mid-sintering temperature and a shrinkage rate of a green substrate on a green sheet, the adjustment including a change of influence depending on a distance from the green sheet. As a result, a diaphragm portion has a protrudent shape toward the side opposite to the window portion of the substrate, and a waviness of a diaphragm structure and/or a warpage of a ceramic plate including diaphragm structures after firing can be advantageously minimized. Accordingly, when a diaphragm structure is used as a sensor, a variance of detection preciseness can be prevented. When a diaphragm structure is used as a piezoelectric/electrostrictive actuator, a deterioration or variance of displacement can be avoided.

What is claimed is:

1. A method for producing a ceramic diaphragm structure, comprising the steps of:
   providing a laminate, comprising:
   i) a ceramic green substrate having at least one window therethrough and a plurality of layers; and
   ii) a thin ceramic green sheet having at least one layer and superposed on the ceramic green substrate so as to cover the at least one window; and
   b) firing the laminate so that the ceramic green sheet provides a diaphragm portion protruding in a direction away from the at least one window;
   wherein the ceramic green substrate and the ceramic green sheet satisfy the formulae:

$$S(\text{substrate}) - S(\text{sheet}) \geq -0.08\{T_{70}(\text{substrate}) - T_{70}(\text{sheet})\} - 1 \quad 1)$$

$$0 \leq T_{70}(\text{substrate}) - T_{70}(\text{sheet}) \leq 300, \quad 2)$$

and $$S(\text{substrate}) - S(\text{sheet}) \leq 20 \quad 3)$$

(wherein S(substrate), and S(sheet) denote shrinkage rates (%) of the ceramic green substrate and the ceramic green sheet, respectively; $T_{70}$(substrate) and $T_{70}$(sheet) denote mid-sintering temperatures (° C.) of the ceramic green substrate and the ceramic green sheet, respectively);

and wherein an average sintering temperature difference, shown by the formula:

$$\sum_{n=1}^{N} T_{70}(\text{substrate})_n \int_{t_n}^{t_{n+1}} \times dx \quad 4)$$

(wherein N denotes the number of layers constituting the ceramic green substrate; $T_{70}$(substrate)$_n$ denotes a mid-sintering temperature (° C.) of a layer positioned in the nth place from the bottom of the laminate in the ceramic green substrate having the ceramic green sheet thereon; $t_n$ and $t_{n+1}$ denote distances from the lower and upper surfaces, respectively, of the layer positioned in the $n^{th}$ place to a neutral line of the substrate after firing the unitary laminate, using (−) for a surface under the neutral line and (+) for a surface over the neutral line);
of the layers of the ceramic green substrate is larger than 0.

2. A method for producing a ceramic diaphragm structure according to claim 1, wherein a mid-sintering temperature (° C.) obtained by the formula:

$$\sum_{n=1}^{M} [A_n \times T_{70}(\text{substrate})_n]/A \qquad 6)$$

(wherein M denotes the number of layers positioned under the neutral line among the layers constituting a ceramic substrate after firing the unitary laminate; $A_n$ denotes the thickness of a layer positioned in the $n^{th}$ place from the bottom of the substrate after firing the unitary laminate; however, concerning the layer positioned in number M, $A_n$ denotes a distance from the lower surface of a layer to the neutral line; $T_{70}$(Substrate)$_n$ denotes a mid-sintering temperature (° C.) of a layer positioned in the $n^{th}$ place from the bottom of the laminate in the ceramic green substrate having the ceramic green sheet thereon; A denotes a distance from the lower surface of the lowest layer to the neutral line of the substrate after firing the unitary laminate);

is larger than a mid-sintering temperature (° C.) of the ceramic green sheet, the mid-sintering temperature (° C.) being obtained by the formula:

$$\sum_{n=1}^{L} [B_n \times T_{70}(\text{sheet})_n]/B \qquad 7)$$

(wherein L denotes the number of layers constituting the ceramic green sheet; $T_{70}$(sheet)$_n$ denotes a mid-sintering temperature (° C.) of a layer positioned in the $n^{th}$ place from the bottom of the laminate constituting the ceramic green sheet when the ceramic green sheet is positioned on the up side of the ceramic green substrate; $B_n$ denotes the thickness of a layer positioned in the $n^{th}$ place from the bottom of the layers constituting a diaphragm plate after firing the unitary laminate; B denotes the thickness of the diaphragm plate).

3. A method for producing a ceramic diaphragm structure according to claim 1, wherein the ceramic green sheet comprises before or after firing a material which is selected from the group consisting of partially stabilized zirconia, completely stabilized zirconia, alumina and a mixture thereof, said material having an average particle diameter of 0.05–1.0 μm.

4. A method for producing a ceramic diaphragm structure, comprising the steps of:
 a) providing a laminate, comprising:
  i) a ceramic green substrate having at least one window therethrough and a plurality of layers; and
  ii) a thin ceramic green sheet having at least one layer and superposed on the ceramic green substrate so as to cover the at least one window; and
 b) firing the laminate so that the ceramic green sheet provides a diaphragm portion protruding in a direction away from the at least one window;
wherein the ceramic green substrate and the ceramic green sheet satisfy the formulae:

$$S(\text{substrate}) - S(\text{sheet}) \geq -0.08\{T_{70}(\text{substrate}) - T_{70}(\text{sheet})\} - 1 \qquad 1)$$

$$0 \leq T_{70}(\text{substrate}) - T_{70}(\text{sheet}) \leq 300, \qquad 2)$$

and $$S(\text{substrate}) - S(\text{sheet}) \leq 20 \qquad 3)$$

(wherein S(substrate), and S(sheet) denote shrinkage rates (%) of the ceramic green substrate and the ceramic green sheet, respectively; $T_{70}$(substrate) and $T_{70}$(sheet) denote mid-sintering temperatures (° C.) of the ceramic green substrate and the ceramic green sheet, respectively);

and wherein an average shrinkage-rate difference, shown by the formula:

$$\sum_{n=1}^{N} S(\text{substrate})_n \int_{t_n}^{t_{n+1}} \times dx \qquad 5)$$

6) (wherein N denotes the number of layers constituting the ceramic green substrate; S(substrate)$_n$ denotes a shrinkage rate (%) of a layer positioned in the $n^{th}$ place from the bottom of the laminate in the ceramic green substrate having the ceramic green sheet thereon; $t_n$ and $t_{n+1}$ denote distances from the lower and upper surfaces, respectively, of the layer positioned in the $n^{th}$ place to a neutral line of the substrate after firing the unitary laminate, using (−) for a surface under the neutral line and (+) for a surface over the neutral line);

of the layers of the ceramic green substrate is larger than 0.

5. A method for producing a ceramic diaphragm structure according to claim 4, wherein a mid-sintering temperature (° C.) obtained by the formula:

$$\sum_{n=1}^{M} [A_n \times T_{70}(\text{substrate})_n]/A \qquad 6)$$

(wherein M denotes the number of layers positioned under the neutral line among the layers constituting a ceramic substrate after firing the unitary laminate; $A_n$ denotes the thickness of a layer positioned in the $n^{th}$ place from the bottom of the substrate after firing the unitary laminate; however, concerning the layer positioned in number M, $A_n$ denotes a distance from the lower surface of a layer to the neutral line; $T_{70}$(Substrate)$_n$ denotes a mid-sintering temperature (° C.) of a layer positioned in the $n^{th}$ place from the bottom of the laminate in the ceramic green substrate having the ceramic green sheet thereon; A denotes a distance from the lower surface of the lowest layer to the neutral line of the substrate after firing the unitary laminate);

is larger than a mid-sintering temperature (° C.) of the ceramic green sheet, the mid-sintering temperature (° C.) being obtained by the formula:

$$\sum_{n=1}^{L} [B_n \times T_{70}(\text{sheet})_n]/B \qquad 7)$$

(wherein L denotes the number of layers constituting the ceramic green sheet; $T_{70}$(sheet)$_n$ denotes a mid-sintering temperature (° C.) of a layer positioned in the $n^{th}$ place from the bottom of the laminate constituting the ceramic green sheet when the ceramic green sheet is positioned on the up side of the ceramic green substrate; $B_n$ denotes the thickness of a layer positioned in the $n^{th}$ place from the bottom of the layers constituting a diaphragm plate after firing the unitary laminate; B denotes the thickness of the diaphragm plate).

6. A method for producing a ceramic diaphragm structure according to claim 2, wherein the ceramic green sheet comprises before or after firing a material which is selected from the group consisting of partially stabilized zirconia, completely stabilized zirconia, alumina and a mixture thereof, said material having an average particle diameter of 0.05–1.0 μm.

* * * * *